US005723076A

United States Patent [19]
Ilyukha et al.

[11] Patent Number: 5,723,076
[45] Date of Patent: Mar. 3, 1998

[54] METHOD OF PRODUCING LARGE POLYCRYSTALLINE PLATES FROM OPTICAL AND SCINTILLATION MATERIALS

[75] Inventors: Aleksandr Ivanovich Ilyukha; Fyodor Antonovich Osadchii; Vladimir Petrovich Seminozhenko; Aleksandr Antonovich Chernyshov; Lyudmila Sergeyevna Gordienko; Pyotr Nikolayevich Onoprienko, all of Kharkov, Ukraine

[73] Assignee: Amcrys-H, Ltd., Kharkov, Ukraine

[21] Appl. No.: 624,517

[22] PCT Filed: Oct. 18, 1994

[86] PCT No.: PCT/UA94/00027

§ 371 Date: Apr. 2, 1996

§ 102(e) Date: Apr. 2, 1996

[87] PCT Pub. No.: WO95/12212

PCT Pub. Date: May 4, 1995

[30] Foreign Application Priority Data

Oct. 20, 1993 [UA] Ukraine ................... 94051492

[51] Int. Cl.[6] .................................. B29D 11/00
[52] U.S. Cl. ............... 264/1.1; 264/1.21; 264/1.23; 264/325; 264/332
[58] Field of Search ................... 264/1.1, 1.21, 264/1.22, 1.23, 325, 332

[56] References Cited

U.S. PATENT DOCUMENTS

| 3,364,525 | 1/1968 | Davy et al. ............... 264/1.23 |
| 3,933,970 | 1/1976 | Rosette et al. |
| 4,044,082 | 8/1977 | Rosette . |
| 4,171,400 | 10/1979 | Rosette et al. |
| 4,217,318 | 8/1980 | Anderson . |
| 4,347,210 | 8/1982 | Maguire ............... 264/320 |
| 4,410,468 | 10/1983 | Packer . |
| 4,522,865 | 6/1985 | Packer . |
| 5,254,293 | 10/1993 | Flicstein et al. . |
| 5,436,764 | 7/1995 | Umetani ............... 264/1.21 |

OTHER PUBLICATIONS

USSR Author's Certificate No. 340,441, with English summary, Jun. 1972.

*Primary Examiner*—James Derrington
*Attorney, Agent, or Firm*—Kinney & Lange, P.A.

[57] ABSTRACT

Method of manufacturing large polycrystalline plates from optical and scintillation materials consists in heating a crystalline blank up to the temperature of $0.5T_{melt.}<T<T_{melt.}$ where $T_{melt.}$—melting temperature of the starting material, as well as thermomechanical deformation by means of profiled surface up to the double thickness of the plate to be obtained, after which the blank is deformed again at the same temperature using flat-parallel surface till the specified thickness. Such technology provides the obtaining of large polycrystalline plates of the specified geometrical form with the necessary sizes.

4 Claims, No Drawings

METHOD OF PRODUCING LARGE POLYCRYSTALLINE PLATES FROM OPTICAL AND SCINTILLATION MATERIALS

BACKGROUND OF THE INVENTION

This invention applies to the technology of manufacturing inorganic optically transparent and scintillation plates of large size by pressure treatment, and to the manufacture of large scintillation detectors and optical screens.

U.S.S.R. Author's Certificate No. 340,441 describes a process for obtaining large plates from optical and scintillation materials. The process employs large, high-quality single crystals, without defects and cracks. The crystals are cut either perpendicularly to the crystal axis, such as for manufacture of discs, or in parallel to or at an angle to the crystal axis for manufacture of large plates. Subsequently, the discs or plates are ground and polished to the necessary size and quality. The process has several shortcomings. More particularly, the process cannot be used to manufacture large products having arbitrary configurations. Additionally, monocrystalline scintillation plates have low resistance to the effects of mechanical handling and heat. As a result, the plates often crack during cutting, making the plates unusable. Moreover, the large single crystal plates are characterized by a non-uniform dispersion of dopant, such as thallium, resulting in inhomogeneity of light output along the area of the detector that is based on monocrystalline scintillation plates.

U.S. Pat. No. 3,933,970 describes a method of producing polycrystalline plates of large size from optical and scintillation materials through the use of thermomechanical axial pressing. According to this process, a cylindrical crystalline blank is cut out of a large ingot grown from the NaI(T1) single crystal melt. The cylindrical size of the blank is approximately 50.8 mm (millimeters) in diameter and 152 mm in height. The blank is placed between graphite coated plates of a 750 ton hydraulic press and is heated in an electric furnace to 500° C. One of the press plates includes a thermocouple for recording the temperature of the press plates. When reaching 500° C., the upper plate is moved at a rate of 9 mm/min, and the crystalline blank is deformed by axial pressing without radial restriction perpendicular to the cylindrical blank bottom. The 9 mm per minute rate is used when pressing crystalline blanks of small size.

When reaching a thickness of 31.75 mm between pressed plates, the upper press plate is removed and the resulting flat crystalline disc is removed. The resulting disc has a diameter of 127 mm and a height of 28.57 mm. To obtain discs of larger size, it becomes necessary to use starting blanks of larger starting diameter and height.

The method described in U.S. Pat. No. 3,933,970, does not permit production of polycrystalline optical and scintillation plates of various geometric shapes, for example, rectangular. More particularly, the blanks employed with the process are in the shape of discs and when deforming by axial pressing without radial restriction, the crystalline structure will seek a shape with minimal surface area, resulting in a disc-shaped product. To obtain other geometric shapes, such as rectangular, the pressed disc must be cut into the desired shape, resulting in a significant amount of waste material (about 36.4%). The high amount of waste decreases the efficiency of the process such that the process has not received wide commercial application.

The process described in U.S. Pat. No. 3,933,970, also requires coating the press plates with graphite to avoid interaction between the press and the pressed material. As a result, it is necessary to remove a layer of the resulting disc that is contaminated by the graphite. The removal of the contaminated layer results in additional waste of base material, and additional steps are required to complete the disc. As an example over 9,000 cc (cubic centimeters) of starting monocrystalline material is required to obtain plates having dimensions of 550 mm by 600 mm by 10 mm thick.

U.S. Pat. No. 4,044,082, describes a method of producing polycrystalline plates of large size from optical scintillation materials by a repeated extrusion process in orthogonal directions. The process described in U.S. Pat. No. 4,044,082 requires two stages. At the first stage, the first stage employs a monocrystalline or polycrystalline NaI(T1) blank having a diameter approximately 119 mm and a height of approximately 100 mm. The blank is extruded to the shape of a parallelepiped at a temperature of 600° C. and is pressed in the extrusion press container through spinnerets having a diameter of 76 mm and under a pressure of 20 tom. As a result, a dense polycrystalline blank having a diameter of 76 mm and a length of 266.7 mm is obtained that is free of holes. During the second stage of the process, the dense polycrystalline blank is cut to a length of 79.5 mm and placed into another extrusion press longitudinally to a spinneret having a rectangular section of 25.4 mm by 50.8 mm. The temperature of the press is raised to 600° C. and the material is pressed through the spinneret under a 10 ton force to obtain a plate having a size of 25.4 mm by 50.8 mm by 279 mm.

The process described in U.S. Pat. No. 4,044,082, can also be used with a monocrystalline blank having a diameter of 127 mm and a height of 177 mm to produce a NaCl plate having dimensions of 270 mm by 12.7 mm by 685 mm.

The process described in U.S. Pat. No. 4,044,082, has several difficulties. The requirement of a double extrusion process doubles the amount of time required to perform the process, thereby doubling the labor and power expenditures. After each extrusion stage, approximately 5 to 10% of the starting material is left in the press, requiring regeneration of the press for the next use, and increasing the waste to up to 20% of the starting material. The use of a double extrusion process as described in U.S. Pat. No. 4,044,082, doubles the equipment cost and leads to increased expenditures in the process.

BRIEF SUMMARY OF THE INVENTION

The present invention provides a process for producing polycrystalline plates of large size from optical and scintillation materials and enables the production of plates of desired geometric shapes while decreasing the amount of waste. The process also permits the use of crystalline blanks having defects such as cracks and cleavages, as well as increases the efficiency of the equipment operation and decreased power input and labor expenditures.

In one embodiment of the invention a polycrystalline plate of large size is manufactured by heating a crystalline blank prepared from a material selected from the group consisting of optical and scintillation materials to a temperature, T, within the range of $0.5\,T_{melt} < T < T_{melt}$ where $T_{melt}$ is the melting temperature of the material. The heated blank is thermomechanically deformed by axially pressing the heated blank with a press having a profiled surface so that a blank with variable thickness is formed having a thickness up to double the thickness of the plate being manufactured. The heated blank of variable thickness is thermomechanically deformed by axially pressing with a press having flat parallel surfaces. The blank is then cooled to form the plate. In one form of this first embodiment, the axial pressing is performed without radial restriction.

In a second embodiment of the invention a polycrystalline plate of large size is manufactured by heating a crystalline blank prepared from a material selected from the group consisting of optical and scintillation materials, to a temperature, T, within the range of $0.5 T_{melt} < T < T_{melt}$, where $T_{melt}$ is the melting temperature of the material. The heated blank is thermomechanically deformed by axially pressing the heated blank using a profiled surface to form a blank having a thickness up to double the thickness of the plate. Subsequently, the heated blank is thermomechanically deformed by axially pressing the blank using flat parallel surfaces to form a blank having a thickness approximately equal to a desired thickness for the plate. The blank is then cooled. In one form of this second embodiment, the axial pressing is performed without radial restriction.

DETAILED DESCRIPTION OF THE PREFERRED EMBODIMENTS

In carrying out the present invention, the process of producing polycrystalline plates of large size from optical and scintillation materials includes heating a crystalline blank to a temperature between $0.5 T_{melt}$ and $T_{melt}$, where $T_{melt}$ is the melting temperature of the starting material. While so heated, the blank is axially pressed thereby thermomechanically deforming the material. The resulting plate is then cooled to room temperature. Thermomechanical deformation by axial pressing is carried out by first pressing the blank using a profiled press surface until a thickness of the material forming the blank is about twice that of the plate to be manufactured. The material is then deformed once again using a flat parallel press surfaces until a desired thickness is achieved. Preferably, axial pressing is accomplished without radial restriction. The profiled surface of the first pressing step breaks the axial symmetry of the material flow process thereby enabling control of the crystalline flow.

The profiled work surface of the formatting press is profiled to promote material flow along directions necessary to achieve the desired profile or geometric configuration. As the profiled work surface of the upper press plate approaches the lower press plate, the profiled work surface permits flow of material and the formation of "channels" of material of variable thickness or height where the crystalline material flows more readily than in other directions. During this first stage of deformation by axial pressing using the profiled press plate surface, the resulting blank of material has a shape quite close in the horizontal plane to the shape desired for the plate being produced, but the thickness of the blank varies with the profile of the press plate. This is a result of the fact that the upper plate surface is profiled and not flat.

During the second stage of axial pressing, using flat parallel press plate surfaces, the thickness of the plate being produced by the process takes its completed form. Hence, during the first part of the process using the profiled plates, the geometric configuration of plate being produced takes its near completed form, whereas during the second part of the process using the flat plates, the surface of the plate being produced is flat with only a slight change of geometric shape.

The control of the crystal flow by the profiled surfaces of the formatting plates permits use of crystalline blanks with considerably less volume, thereby increasing the efficiency of the process reducing waste, and decreasing labor and power for the process. Reduction of the power necessary to perform the process increases the durability of the equipment, reducing replacement costs. Moreover, the use of profiled material pressing permits use of monocrystalline or polycrystalline blanks having cracks or other infirmities. The crystalline material flow at an elevated temperature is performed by the present invention permits plastic deformation of the material which, coupled with the curing process, cures minor defects and cracks in the material. Moreover, the plastic deformation effectively grips or welds any cracks existing in the blanks, thereby permitting the use of monocrystalline blanks with cracks and cleavages not capable of being used in prior processes.

When performing the process according to the present invention, a double mixing of crystalline material can be observed, thereby making the structure of the manufactured material more homogeneous and increasing the mechanical stability of the resulting plate. Since the manufactured plate has greater homogeneity, including to its edges, the entire plate may be employed in the final product, rather than only a central portion as in prior processes where different crystal entities occur at the periphery. Moreover, the use of small starting volumes of crystalline blanks in the present invention permits the time required to perform the process to be minimized thereby decreasing power and labor expenditures to obtain large polycrystalline plates from optical and scintillation single crystals.

The following sets forth several examples of the present invention.

EXAMPLE 1

In a first example, a NaI (T1) single crystal starting material was grown and placed in a "dry" box, and treated with ethyl alcohol. A starting blank of high quality crystalline material, without defects and cracks, was cut from the starting material having a cylindrical shape with a diameter of 185 mm and a height of 42 mm. The blank was placed between the plates of a 250 ton hydraulic press having an upper plate having a profiled surface, the profiling being arranged to fulfill primary crystal flow in the direction specified by the profiling. The crystalline blank was sealed off from the formatting press plates through a packing material that protects the crystalline material from interacting with the plate material. An electric furnace heated the plates and maintained the temperature at approximately 500° C., which is between $0.5 T_{melt}$ and $T_{melt}$. The temperature was registered by a recorder connected to thermocouples associated with the press plate on which the blank was placed. The upper plate surface provided initial deformation of the blank by axial pressing. The press was operated at a press rate of approximately 0.4 mm per minute with the press at 500° C., thereby pressing the crystalline blank to a height of approximately twice the thickness of the plate being manufactured. The upper press plate was then lifted and the press process was continued using a flat upper press plate surface parallel to the lower press plate surface, until the blank reached the required thickness as indicated by the press. The deformation process required approximately 130 tons of force after which the pressure was reduced. The upper press plate was then elevated to some distance, approximately 10 to 15 mm above the blank and the manufactured blank was cooled to room temperature. The resulting manufactured plate had a rectangular shape approximately 550 mm by 600 mm with a thickness of approximately 10 mm. The plate was extracted and ground and polished, resulting in a polycrystalline plate with no cracks or cleavages and optically transparent.

EXAMPLE 2

In Example 2, a process similar to that described in Example 1 was carried out employing a starting crystalline blank of NaI (Tl) having a diameter of 180 mm and a length of 242 mm. In the case of Example 2, the blank had cracks. The process of high temperature profiled pressure cured the cracks and created a structural homogeneity of the manufactured plate. As a result, the efficiency of use of starting material is substantially increased, and approximately doubled in comparison to prior techniques where high quality monocrystalline blanks were required.

EXAMPLE 3

Example 3 employed a starting monocrystalline high-quality blank (without cracks and cleavages) with a diameter of 185 mm and a height of 242 mm cut from a KCl single crystal grown with arbitrary orientation. This blank was placed in the hydraulic press as described in Example 1 and operated with a profiled press plate as described in Example 1 at a temperature of 550° C., which is between 0.5 $T_{melt}$ and $T_{melt}$. The process resulted in a rectangular plate having dimensions of 550 mm by 600 mm and a thickness of 10 mm.

EXAMPLE 4

Example 4 was similar to Example 1 but used a crystalline structure of CsI(Na, Tl), again in cylindrical form having a diameter of 185 mm and a height of 242 mm. The operating temperature was 450° C., which is between 0.5 $T_{max}$ and $T_{melt}$ and the force generating pressure was 90 tons. The resulting polycrystalline optically transparent plate had a dimensions of 550 mm by 600 mm by 10 mm with no discernable cracks, cleavages, or other defects.

The following table compares Examples 1–4 of the process of the present invention to the processes performed by the prior art, and particularly those described in U.S. Pat. Nos. 3,933,970 and 4,044,082. In each case, a plate having final dimensions of 550 mm by 600 mm by 10 mm thick was produced after final grinding and polishing. For purposes of comparison, "high quality" as used in the table means that the starting crystalline blank was without cleavages, cracks or other defects, and the term "cracks" means that the starting crystalline blank had cracks and was not of high quality. The waste quantity included waste due to trimming to achieve the desired rectangular shape, as well as waste due to grinding and polishing. The time identified includes the time necessary for growing a single crystal from which the starting crystalline blank is cut.

TABLE I

Comparison of Crystalline Plates

| Example | Material | Quality | Volume (cc) | Blank size (mm) | Waste (%) | Time (hours) |
|---|---|---|---|---|---|---|
| 1 | NaI (Tl) | high quality | 6500 | 185 dia, 242 length | 20 | 250 |
| 2 | NaI (Tl) | cracks | 6500 | 185 dia, 242 length | 20 | 250 |
| 3 | KCl | high quality | 6500 | 185 dia, 242 length | 20 | 250 |
| 4 | CsI (Na, Tl) | high quality | 6500 | 185 dia, 242 length | 20 | 250 |
| axial pressing PN 3933970 | NaI (Tl) | high quality | 9000 | 185 dia, 334 length | 36.4 | 325 |

TABLE I-continued

Comparison of Crystalline Plates

| Example | Material | Quality | Volume (cc) | Blank size (mm) | Waste (%) | Time (hours) |
|---|---|---|---|---|---|---|
| extrusion PN 4044082 | NaI (Tl) | high quality | 142477 | 500 dia, 600 length | 96.6 | 750 |

The size of the plates obtained by the present invention is defined by the starting blank's sizes and the abilities of the press equipment.

Using the present invention, it is possible to manufacture a large polycrystalline plates of desired geometrical profile. The starting crystalline blanks may be used even though they have cracks and cleavages, thereby reducing the amount of waste over prior processes. Moreover, the time required for processing monocrystalline blanks is reduced by approximately 30 percent using the present invention. Quantity of material waste is reduced from approximately 36.4% in the prior processes to approximately 20% in the process of the present invention, considering the final grinding and processing of the rectangular plate. The present invention further permits control of the crystalline material flow to decrease the pressures at which the axial pressing process takes place, thereby decreasing wear on the equipment and increasing equipment durability. The process also improves homogeneity of the crystalline structure and as a consequence, it improves the mechanical stability of the manufactured plate by virtue of the double mixing of the material as a result of the two-step process of profiled axial press and double grain refining from the plate center to the periphery.

The present invention thus provides a process of obtaining large polycrystalline plates, such as greater than approximately 460 mm by 460 mm and 9 mm thick. The process may be used in the industrial production of such plates for detectors and large area screens, particularly those applied in the radiophysical medical equipment.

Although the present invention has been described with reference to preferred embodiments, workers skilled in the art will recognize that changes may be made in form and detail without departing from the spirit and scope of the invention.

We claim:

1. A method of manufacturing a polycrystalline plate of large size comprising:

heating a crystalline blank prepared from a material selected from the group consisting of optical and scintillation materials to a temperature, T, within the range of 0.5 $T_{melt} < T < T_{melt}$ where $T_{melt}$ is the melting temperature of the material, thermomechanically deforming the heated blank by axially pressing with a press having a profiled surface whereby a blank with variable thickness is formed and wherein the blank has a thickness up to double the thickness of the plate, thermomechanically deforming the heated blank of variable thickness by axially pressing with a press having flat parallel surfaces, and cooling the blank, whereby the plate is formed.

2. The process of claim 1 wherein axial pressing is performed without radial restriction.

3. A method of manufacturing a polycrystalline plate of large size comprising:

heating a crystalline blank prepared from a material selected from the group consisting of optical and scintillation materials, to a temperature, T, within the range of $0.5\ T_{melt} < T_{melt}$ where $T_{melt}$ is the melting temperature of the material, thermomechanically deforming the heated blank by axially pressing the blank using a profiled surface to form a blank having a thickness that varies with the profiled surface and a thickness to double the thickness of the plate, subsequently thermomechanically deforming the heated blank by axially pressing the blank using flat parallel surfaces to form a blank having a thickness approximately equal to a desired thickness for the plate, and cooling the blank.

4. The process of claim 3 wherein axial pressing is performed without radial restriction.

* * * * *